United States Patent [19]
Elias et al.

[11] 4,181,842
[45] Jan. 1, 1980

[54] D.C. MONITORING CIRCUIT

[75] Inventors: Jack Elias, Lansdale; Theodore B. Bozarth, Perkasie, both of Pa.

[73] Assignee: Honeywell Inc., Minneapolis, Minn.

[21] Appl. No.: 722,785

[22] Filed: Sep. 13, 1976

[51] Int. Cl.² .............................................. H02J 9/00
[52] U.S. Cl. ........................................ 307/66; 307/64
[58] Field of Search .............................. 307/64, 66, 23

[56] References Cited

U.S. PATENT DOCUMENTS

| | | | |
|---|---|---|---|
| 3,631,257 | 12/1971 | Behr et al. | 307/66 |
| 3,816,804 | 6/1974 | Cardwell, Jr. | 307/66 |
| 3,821,626 | 6/1974 | Maver et al. | 307/66 |
| 3,925,772 | 12/1975 | Miller et al. | 307/66 |
| 3,942,028 | 3/1976 | Baker | 307/66 |
| 4,010,381 | 3/1977 | Fickenscher et al. | 307/66 |

*Primary Examiner*—Gene Z. Rubinson
*Assistant Examiner*—Eugene S. Indyk
*Attorney, Agent, or Firm*—Laurence J. Marhoefer; Lockwood D. Burton

[57] ABSTRACT

A power supply structure for an electronic system includes a primary power source and a stand-by or secondary power source. The secondary power source is ground circuit isolated from the primary source. A monitoring circuit, which is energized from the secondary source is connected to monitor the primary source for incipient failure, then to produce an output signal which may be used to trigger an alarm and/or switch the secondary power source into energizing connection with respect to the electronic system.

6 Claims, 1 Drawing Figure

U.S. Patent
Jan. 1, 1980
4,181,842
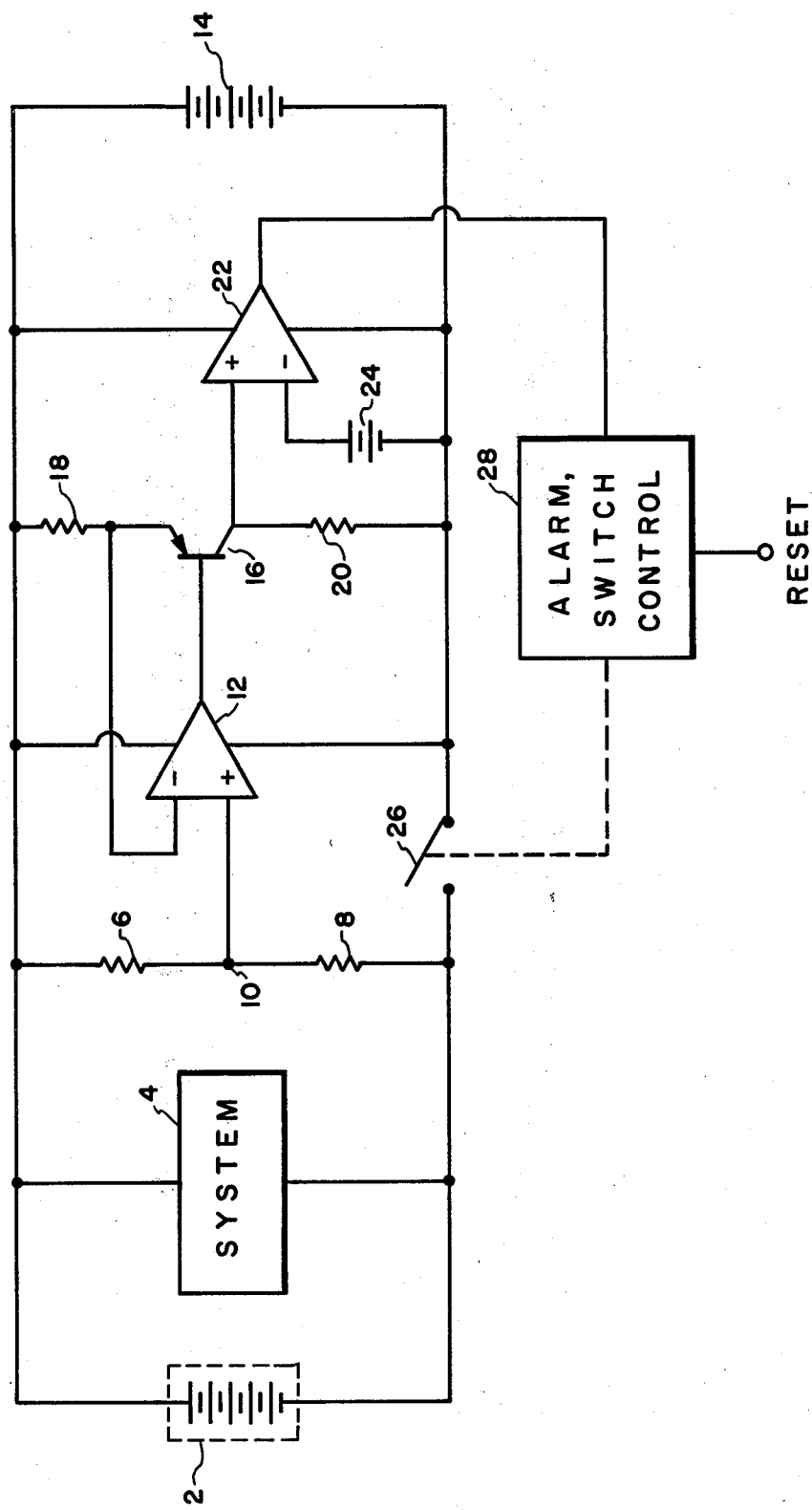

D.C. MONITORING CIRCUIT

BACKGROUND OF THE INVENTION

1. Field of the Invention

The present invention relates to sensing circuits, and more particularly, to a d.c. voltage level monitoring circuit.

In many electronic systems, the direct current energization for the system is supplied by a power supply network which is, in turn, connected to an a.c. power line. When, for example, such electronic system comprises a computer, it is essential to have an auxiliary power source which is capable of energizing the system in the event of a failure of any sort in the primary power source. In some instances, the use of a simple voltage monitoring technique is not feasible. For example, it may be necessary that a negative or ground reference lead of the auxiliary or secondary supply be isolated from the corresponding lead of the primary supply until such time as the system is energized from the secondary or auxiliary supply source.

SUMMARY OF THE INVENTION

It is, accordingly, an object of the present invention to provide an improved voltage monitoring means providing isolation between primary and secondary voltage source means.

It is another object of the present invention to provide an improved voltage monitoring means as set forth which is characterized in simplicity of structure and operation.

In accomplishing these and other objects, there has been provided, in accordance with the present invention, a monitoring means wherein means are provided for sensing the voltage of the primary source, converting that voltage to a current as a means of effecting the isolation. The converted current is then reconverted to a voltage signal which is, in turn, compared with a reference signal to provide an output signal whenever the primary source changes beyond a predetermined level.

BRIEF DESCRIPTION OF THE DRAWINGS

A better understanding of the present invention may be had from the following detailed description when read in the light of the accompanying drawing in which the single FIGURE is a schematic block diagram of a circuit embodying the present invention.

DETAILED DESCRIPTION

Referring now to the drawing in more detail, there is shown in the single FIGURE, a primary power supply represented by a battery 2. An electronic system 4 which may, for example, be a digital apparatus such as a computer, is connected across the power supply 2 to be energized thereby. A first resistor 6 and a second resistor 8 are serially connected across the power supply 2 to comprise a voltage divider at the junction 10 between the two resistors. The junction 10 is connected to the non-inverting input of an amplifier 12.

A secondary or stand-by power source is represented by a battery 14. In order to assure that the sensing circuit will remain active and energized even though the primary power supply is failing, that sensing circuit, including the amplifier 12, is energized from the back-up or secondary power source 14. The output of the amplifier 12 is connected to the base electrode of a transistor 16. The emitter of the transistor 16 is connected through a resistor 18 to the common positive lead connected in turn to both the primary power supply 2 and the secondary power supply 14. A feedback connection is made from the junction between the resistor 18 and the emitter of the transistor 16 to the inverting input of the amplifier 12. The collector of the transistor 16 is connected through a resistor 20 to the negative lead of the secondary power supply 14. The collector of the transistor 16 is also connected to the non-inverting input terminal of a comparator amplifier 22. The inverting input terminal of which is connected to a reference potential represented by the battery 24.

It will be noted that the negative lead of the primary power supply 2 is isolated from the negative lead of the secondary power supply 14. A switch 26 is provided which may be actuated, when closed, to connect the negative lead of the secondary power supply 14 to the negative lead of the primary system 2. The output terminal of the comparator 22 is connected to the input of an alarm and switch control circuit 28. The switch 26 is operated in response to the activation of the alarm and switch control circuit by an output signal from the comparator 22.

In operation, the system 4 is connected to and energized by the primary power supply 2. The switch 26 is open and the secondary or auxiliary power supply 14 is ground circuit isolated from the primary supply 2 and from the system 4. It is in stand-by condition, ready to take over and energize the system 4 should there be a failure in the primary power supply 2. In order to detect an incipient failure of the primary power supply 2, there is provided the voltage monitor circuit. In order for the voltage monitor circuit to be energized and active even after a failure of the primary power supply 2, it is necessary that the voltage monitoring circuit be powered and energized from the auxiliary or secondary power supply 14. For purposes and reasons not necessarily pertinent to the present invention, it is essential that the negative or ground lead of the secondary power supply 14 be isolated, under normal operating conditions, from the negative terminal or ground lead of the primary power supply 2. This requirement of the circuit makes it impractical, if not impossible, to monitor the voltage across the primary power supply with a simple voltage monitoring circuit. Thus, the voltage monitoring circuit of the present invention is effectively isolated from the primary power supply 2.

As previously mentioned, the arrangement of the voltage monitoring circuit of the present invention comprises a voltage-to-current and a current-to-voltage conversion network which permits the desired power supply isolation. To this end, the voltage at the junction 10 of the voltage divider comprised of the resistors 6 and 8 connected across the primary power supply 2, a sample of the voltage across the primary source 2, is applied to the non-inverting input of the amplifier 12. The output of the amplifier 12, connected to the base of the transistor 16, causes a current to flow through the transistor 16 which is a function of the magnitude of the voltage at the junction 10. The feedback to the inverting input of the amplifier 12 from the junction between the resistor 18 and the emitter of the transistor 16 renders the amplifier 12 a voltage follower. Thus, the amplifier 12 and transistor 16 comprise a voltage-to-current converter wherein the current through the transistor 16 is proportional to the magnitude of the voltage at the junction 10.

The current through the transistor 16 is caused to flow through the resistor 20 to produce a voltage corresponding thereto, thereby constituting a current-to-voltage converter. The resulting voltage across the resistor 20 is applied to the non-inverting input terminal of the amplifier 22 where it is compared with the reference signal represented by the battery 24 connected to the inverting input terminal of the amplifier 22, the amplifier 22 thereby constituting a comparator. So long as the voltage across the resistor 22 is greater than the reference voltage 24, the output signal of the comparator 22 will be high. Such a high output signal from the comparator 22 when applied to the alarm and switch control circuit 28 leaves the switch 26 in the open condition and the alarm circuit inactive.

On the other hand, however, if the voltage across the primary power supply 2, begins to diminish, that diminution is reflected at the junction 10. When that reduction is applied to the input of the amplifier 12, it, in turn, causes a reduction in the amount of current flowing through the transistor 16, hence, a lowering of the voltage across the resistor 20. When the voltage across the resistor 20 is reduced to equality with the reference signal 24, the output of the comparator 22 changes state to a low signal. That low signal, when applied to the alarm and switch control circuit 28, activates the alarm and closes the switch 26. The closure of the switch 26 connects the secondary power supply 14 across the system 4 whereby the system 4 is energized by the secondary power supply 14. It will, of course, be recognized that the alarm and switch control circuit may be reset to its original condition by an external signal whenever the primary power supply 2 has been restored to normal operation.

While the structure has been described as relating to the detection of a decrease in the voltage of the primary power supply means, to a level equal to or less than that represented by the reference source 24, it will be recognized that, without departing from the spirit and scope of the invention, the relative magnitudes may be reversed, should the need or desire arise.

Thus, there has been provided, in accordance with the present invention, an improved voltage monitoring system wherein the voltage monitoring system is energized from a source which is ground circuit isolated from the source of voltage being monitored.

The embodiments of the invention in which an exclusive property or privilege is claimed are defined as follows:

1. A power supply structure for a utilization system comprising
   a primary power supply means and a secondary power supply means,
   said primary power supply means being connected in energizing relation with said utilization system,
   said secondary power supply means being arranged in circuit ground isolation with respect to said primary power supply means,
   sampling means for sampling the voltage across said primary power supply means,
   a voltage monitoring circuit connected to be energized by said secondary power supply means,
   said voltage monitoring circuit including a voltage-to-current converter connected to produce a current signal proportional to the voltage sample provided by said sampling means,
   said voltage monitoring circuit further including a current-to-voltage converter connected to produce a voltage signal proportional to said proportional current signal, and
   comparator means connected to compare said proportional voltage signal with a fixed reference signal to produce an output signal representative of said comparison.

2. A power supply structure for a utilization system comprising
   a primary power supply means and a secondary power supply means,
   said primary power supply means being connected in energizing relation with said utilization system,
   said secondary power supply means being arranged in circuit ground isolation with respect to said primary power supply means,
   sampling means for sampling the voltage across said primary power supply means,
   a voltage monitoring circuit connected to be energized by said secondary power supply means,
   said voltage monitoring circuit including a voltage-to-current converter connected to produce a current signal proportional to the voltage sample provided by said sampling means,
   said voltage monitoring circuit further including a current-to-voltage converter connected to produce a voltage signal proportional to said proportional current signal,
   a comparator means connected to compare said proportional voltage signal with a fixed reference signal to produce an output signal representative of said comparison, and
   means responsive to a change of state of said output signal to connect said secondary power supply means in energizing relation with said utilization system.

3. The power supply structure as set forth in claim 2 wherein said sampling means comprises a voltage divider connected across said primary power supply means.

4. The power supply structure as set forth in claim 3 wherein said voltage monitoring circuit comprises means to detect an incipient failure of said primary power supply means.

5. The power supply structure as set forth in claim 4 wherein said means responsive to said change of state of said output signal includes switch means operable to effect the connection of said secondary power supply means to said utilization system.

6. A power supply structure for a utilization system comprising
   a primary power supply means and a secondary power supply means,
   said primary power supply means being connected in energizing relation with said utilization system,
   said secondary power supply means being arranged in circuit ground isolation with respect to said primary power supply means,
   sampling means for sampling the voltage across said primary power supply neans, said sampling means including a first and a second resistor serially connected across said primary power supply means as a voltage divider,
   a voltage monitoring circuit connected to be energized by said secondary power supply means, said voltage monitoring circuit including a first amplifier having a first input terminal connected to the junction between said first and second resistor, said first amplifier having an output terminal connected to the base electrode of a transistor, the emitter of said transistor being connected through a third resistor to the positive lead of said secondary power supply means, the collector of said transistor being connected through a fourth resistor to the negative lead of said secondary power supply means, a feedback connection from said emitter of said transistor to a second input terminal of said first amplifier, said first amplifier and said transistor comprising a voltage-to-current converter for producing a current signal through said transistor which is proportional to said sampled voltage at said junction between said first and second resistors, said voltage monitoring circuit further including a comparator amplifier having a first input terminal connected to the junction between said collector of said transistor and said fourth resistor, said fourth resistor comprising a current to-voltage converter for producing a voltage signal at said first input terminal of said comparator amplifier which is proportional to the current through said transistor, said comparator amplifier having a second input terminal connected to a reference voltage means whereby to compare said proportional voltage with said reference voltage to produce a change of state of an output signal from said comparator indicative of an incipient failure of said primary power supply means, and means including switch means responsive to said change in said output signal to connect said secondary power supply means in energizing relation with said utilization system.

* * * * *